United States Patent
Kang

(10) Patent No.: US 9,431,114 B2
(45) Date of Patent: Aug. 30, 2016

(54) SEMICONDUCTOR DEVICE AND METHOD OF OPERATING THE SAME USING STATE CODE

(71) Applicant: SK hynix Inc., Icheon (KR)

(72) Inventor: Tai Kyu Kang, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/695,849

(22) Filed: Apr. 24, 2015

(65) Prior Publication Data

US 2016/0172042 A1    Jun. 16, 2016

(30) Foreign Application Priority Data

Dec. 12, 2014    (KR) .................. 10-2014-0179789

(51) Int. Cl.
*G11C 16/04*    (2006.01)
*G11C 16/14*    (2006.01)
*G11C 16/26*    (2006.01)
*G11C 16/34*    (2006.01)
G11C 16/08    (2006.01)
G11C 16/10    (2006.01)

(52) U.S. Cl.
CPC ............... *G11C 16/14* (2013.01); *G11C 16/26* (2013.01); *G11C 16/3445* (2013.01); *G11C 16/3459* (2013.01); G11C 16/08 (2013.01); G11C 16/10 (2013.01)

(58) Field of Classification Search
CPC ........ G11C 16/08; G11C 16/10; G11C 16/16
USPC ............. 365/185.11, 185.18, 185.29, 185.24
See application file for complete search history.

(56) References Cited

U.S. PATENT DOCUMENTS

| 2007/0183216 A1* | 8/2007 | Chun | ..................... G11C 16/12 365/185.25 |
|---|---|---|---|
| 2008/0049499 A1* | 2/2008 | Lee | ......................... G11C 8/12 365/185.04 |
| 2015/0019791 A1* | 1/2015 | Yoo | ..................... G06F 12/0246 711/102 |

FOREIGN PATENT DOCUMENTS

KR    10-0634433 B1    10/2006

* cited by examiner

*Primary Examiner* — Connie Yoha

(57) ABSTRACT

A method of operating a semiconductor device includes dividing an operation of the semiconductor device into a plurality of periods, and determining a plurality of state codes respectively corresponding to the periods; performing the operation according to a received command; when a pause command is received, pausing the operation and storing a state code of the plurality of state codes corresponding to a paused period among the plurality of periods; and performing the operation starting from a period determined according to the stored state code when a resumption command is received.

19 Claims, 6 Drawing Sheets

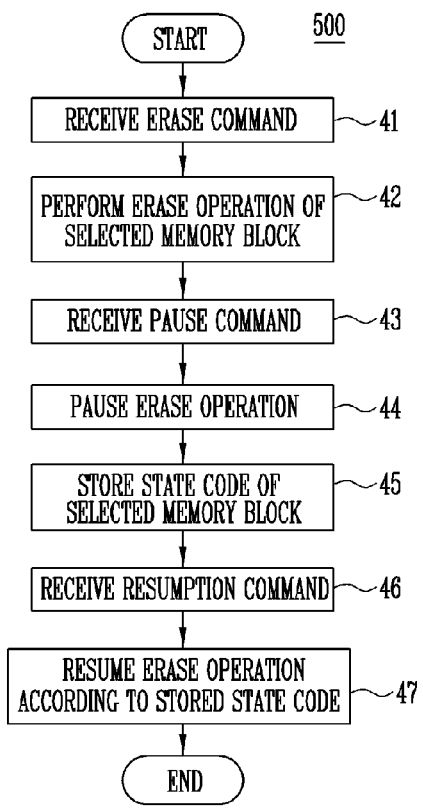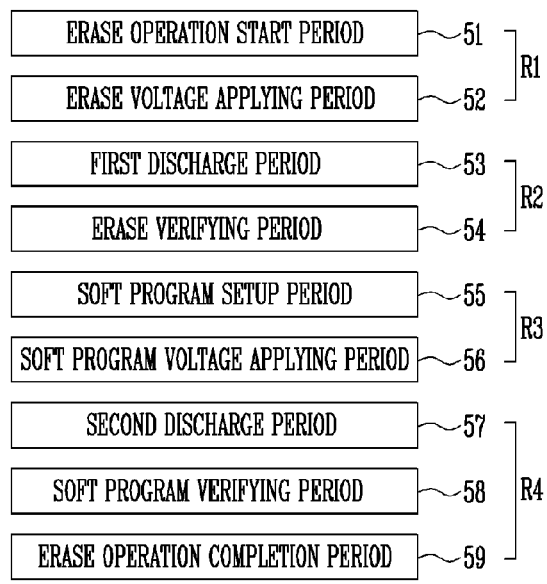

SEMICONDUCTOR DEVICE AND METHOD OF OPERATING THE SAME USING STATE CODE

CROSS-REFERENCE TO RELATED APPLICATION

The present application claims priority to Korean Patent Application Number 10-2014-0179789, filed on Dec. 12, 2014, the entire disclosure of which is herein incorporated by reference in its entirety.

BACKGROUND

1. Field of Invention

The present disclosure relates to a semiconductor device and a method of operating the same. More specifically, the present disclosure relates to pause and resumption operations of a semiconductor device.

2. Description of Related Art

A semiconductor device includes a plurality of memory blocks in which data is stored, and performs program, read, and erase operations of a selected memory block according to a command received from a control device.

When a pause command is received from the control device while the program, read, or erase operation is being performed, the semiconductor device pauses an operation which is being performed, and when a resumption command is received, may perform the paused operation again.

For example, the erase operation includes an operation of erasing memory cells included in the selected memory block, and an operation of performing a soft program operation on the erased memory cells. Further, the operation of erasing the memory cells and the operation of performing the soft program operation may each include various sub-operations. When a pause command is input while the soft program operation is being performed, the soft program operation which is being performed is paused. After this, when a resumption command is input, the erase operation may be performed again from the beginning, and as a result the memory cells in which the erase operation is completed may be over-erased. Over-erasing may cause threshold voltage distributions of the memory cells to be widened, and an operating time of a resumed operation may be increased.

SUMMARY

The present disclosure is directed to a semiconductor device capable of reducing an operating time of the semiconductor device, and a method of operating the same.

One aspect of the present disclosure includes a method of operating a semiconductor device, including: dividing an operation of the semiconductor device into a plurality of periods, and determining a plurality of state codes respectively corresponding to the periods; performing the operation according to a received command; when a pause command is received, pausing the operation and storing a state code of the plurality of state codes corresponding to a paused period among the plurality of periods; and performing the operation starting from a period determined according to the stored state code when a resumption command is received.

Another aspect of the present disclosure includes a semiconductor device, including: memory blocks in which data is stored; a peripheral circuit configured to perform a program operation, a read operation, or an erase operation of a selected memory block among the memory blocks; and a control circuit configured to control the peripheral circuit to pause an operation performed on the selected memory block and store a state code with respect to the paused operation in a specified memory block when a pause command is received, and to perform the paused operation of the selected memory block according to the state code stored in the specified memory block when a resumption command is received.

Still another aspect of the present disclosure includes a semiconductor device, including: a first memory block in which normal data is stored; a second memory block in which a state code corresponding to an operation that is paused is stored; a peripheral circuit configured to perform a program, read, or erase operation of the first memory block, store the state code in the second memory block, and read the state code from the second memory block; and a control circuit configured to control the peripheral circuit to store the state code in the second memory block when the operation which is being performed in the first memory block is temporarily paused, and to control the peripheral circuit to resume the paused operation according to the state code.

BRIEF DESCRIPTION OF THE DRAWINGS

The above and other features and advantages of the present disclosure will be apparent to those of ordinary skill in the art in detailed illustrative embodiments thereof described with reference to the attached drawings, in which:

FIG. 5 is a flowchart of a method of performing an operation according to an embodiment;

FIG. 6 is a diagram of various operations performed in an erase operation according to an embodiment;

DETAILED DESCRIPTION

Illustrative embodiments of the present disclosure will be described more fully hereinafter with reference to the accompanying drawings. However, embodiments may have different forms and should not be construed as limited to the embodiments set forth herein. Illustrative embodiments are described below in sufficient detail with reference to accompanying drawings to enable those of ordinary skill in the art to embody and practice the present disclosure.

Figure 1:
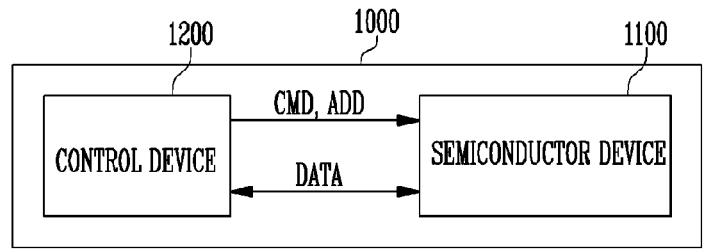
FIG. 1 is a diagram illustrating a memory system according to an embodiment of the present disclosure.

FIG. 1 is a diagram illustrating a memory system according to an embodiment.

Referring to FIG. 1, a memory system 1000 may include a semiconductor device 1100 in which data is stored, and a control device 1200 controlling the semiconductor device 1100. For example, the control device 1200 may transfer a command signal CMD and an address ADD to the semiconductor device 1100, and the semiconductor device 1100 may perform program, read, and erase operations in response to the command signal CMD and the address ADD, and exchange data DATA with the control device 1200.

Further, the control device 1200 may transfer a pause command to the semiconductor device 1100 when the semiconductor device 1100 is performing the program, read, or erase operation, thereby pausing the operation being performed, and transfer a resumption command to the semiconductor device 1100 so that the paused operation is resumed. The semiconductor device 1100 may store a state code indicating a state of the program, read, or erase operation which is being performed on a selected memory block when the pause command is received, and subsequently perform the paused operation according to the stored state code when the resumption command is received. That is, when the resumption command is received, the semiconductor device 1100 may not resume the paused operation at the beginning, but may instead resume the paused operation at a later point corresponding to a paused sub-operation. The semiconductor device 1100 will be described in detail below.

Figure 2:
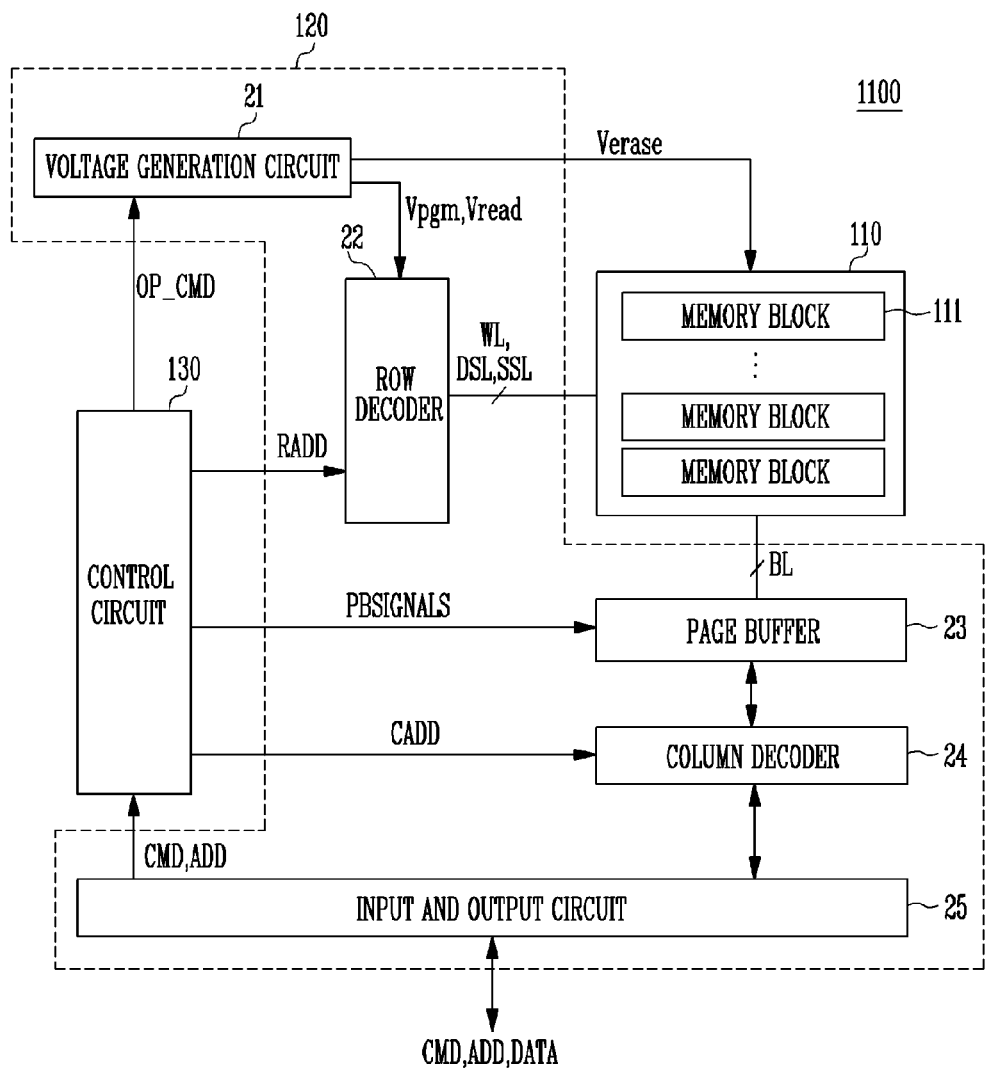
FIG. 2 is a diagram illustrating a semiconductor device according to an embodiment.

FIG. 2 is a diagram illustrating a semiconductor device according to an embodiment.

Referring to FIG. 2, the semiconductor device 1100 may include a memory cell array 110 in which data is stored, a peripheral circuit 120 performing program, read, and erase operations of the memory cell array 110, and a control circuit 130 controlling the peripheral circuit 120.

The memory cell array 110 may include a plurality of memory blocks 111. Each memory block 111 may include a plurality of cell strings, and the cell strings may be implemented to have a two-dimensional or three-dimensional structure according to an arrangement direction of memory cells. The two-dimensional structure may mean a structure in which the memory cells are arranged in a horizontal direction relative to a substrate, and the three-dimensional structure may mean a structure in which the memory cells are arranged in a vertical direction relative to the substrate. When an operation on a selected memory block 111 is paused, a state code with respect to the paused operation may be stored in a predetermined memory block among the memory blocks 111.

The peripheral circuit 120 may include a voltage generation circuit 21, a row decoder 22, a page buffer 23, a column decoder 24, and an input and output circuit 25.

The voltage generation circuit 21 may generate operating voltages having various levels in response to an operating command signal OP_CMD. The operating command signal OP_CMD may include signals related to a program command, a read command, an erase command, a pause command, and a resumption command, respectively. For example, the voltage generation circuit 21 may generate an erase voltage Vera, a program voltage Vpgm, and a read voltage Vread, and generate voltages having various other levels as well.

The row decoder 22 may select one among the memory blocks 111 included in the memory cell array 110 in response to a row address RADD, and transfer the operating voltages to word lines WL, drain select lines DSL, source select lines SSL, bit lines BL, and source lines SL which are connected to the selected memory block 111.

The page buffer 23 may be connected to the memory blocks 111 via the bit lines BL, exchange data with the selected memory block 111 in response to page buffer control signals PBSIGNALS during the program, read, and erase operations, and temporarily store the exchanged data.

The column decoder 24 may exchange data with the page buffer 23 in response to a column address CADD.

The input and output circuit 25 may transfer the command signal CMD and the address ADD transferred from outside of the semiconductor device 1100 to the control circuit 130, transfer data DATA transferred from the outside to the column decoder 24, and output data DATA transferred from the column decoder 24 to the outside or transfer the data DATA to the control circuit 130.

The control circuit 130 may control the peripheral circuit 120 in response to the command signal CMD and the address ADD. For example, the control circuit 130 may control the peripheral circuit 120 to perform one of the program operation, the read operation, and the erase operation in response to the command signal CMD and the address ADD, to pause the operation being performed according to the pause command, and to resume the paused operation according to the resumption command.

Particularly, the control circuit 130 may control the peripheral circuit 120 to pause the operation which is being performed when the pause command is received, and to store a state code of the memory block upon which the paused operation was being performed in a specified memory block. Further, when the resumption command is received, the control circuit 130 may control the peripheral circuit 120 to read the state code from the specified memory block, and to resume performing the paused operation according to the read state code.

The memory block will be described in detail below.

Figure 3:
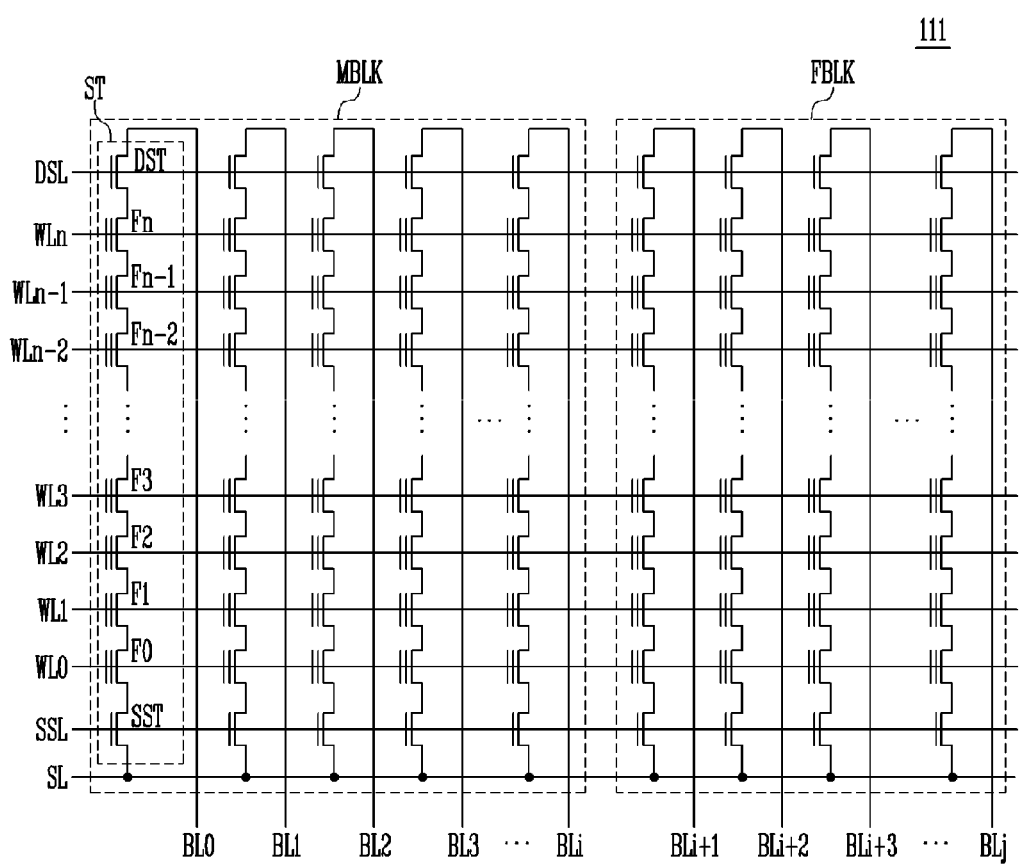
FIG. 3 is a circuit diagram illustrating a memory block suitable for use in an embodiment.

FIG. 3 is a circuit diagram illustrating a memory block 111 according to an embodiment. The memory block 111 is illustrated as including cell strings having a two-dimensional structure, but embodiments are not limited thereto.

The memory block 111 may include a main block MBLK and a flag block FBLK. The main block MBLK and the flag block FBLK have the same structure, but may differ in a kind of data respectively stored therein.

Cell strings ST included in the main block MBLK and the flag block FBLK may be connected between the first to j+1$^{th}$ bit lines BL0 to BLj and the source line SL, respectively. The cell strings ST may respectively include source select transistors SST, pluralities of first to n+1$^{th}$ memory cells F0 to Fn, and drain select transistors DST. The source select transistors SST may be connected between the source line SL and the first memory cells F0, respectively, and the drain select transistors DST may be connected between a respective one of the first to j+1$^{th}$ bit lines BL0 to BLj and the n+1$^{th}$ memory cells Fn, respectively. Gates of the source select transistors SST may be connected to the source select line SSL, gates of the memory cells F0 to Fn may be connected to the respective first to n+1$^{th}$ word lines WL0 to WLn, and gates of the drain select transistors DST may be connected to the drain select line DSL. A group of the memory cells connected to the same word line may be referred to as a page.

Normal (e.g., user) data may be stored in the memory cells of the main block MBLK, and flag data used in internal processes of the semiconductor device 1100 may be stored in the memory cells of the flag block FBLK. Various kinds of data may be included in the flag data, including, for example, data indicating a program state of each page.

When an operation of the selected memory block 111 is temporarily paused, a state code with respect to the paused operation may be stored in the predetermined memory block 111 among the plurality of memory blocks 111.

Figure 4:
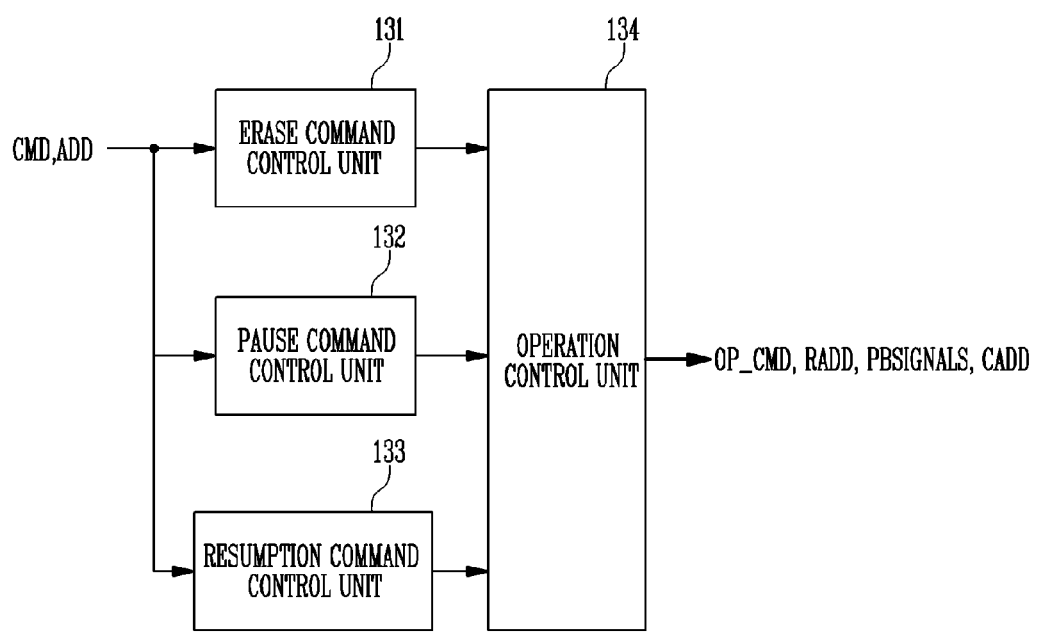
FIG. 4 is a diagram illustrating a control circuit according to an embodiment.

FIG. 4 is a detailed diagram illustrating a control circuit 130 suitable for use as the control circuit 130 of FIG. 1, according to an embodiment.

Referring to FIG. 4, the control circuit 130 may include an erase command control unit 131, a pause command control unit 132, a resumption command control unit 133, and an operation control unit 134. In an embodiment, the erase command, pause command, resumption command, and operation control units 131, 132, 133, and 134 include respective distinct circuits. In an embodiment, a microcontroller, sequencer, or state machine circuit provides the functionality of the erase command, pause command, resumption command, and operation control units 131, 132, 133, and 134.

When the command signal CMD received by the control circuit 130 is related to the erase command, the erase command control unit 131 may be operated. When the command signal CMD is related to the pause command, the pause command control unit 132 may be operated. When the command signal CMD is related to the resumption command, the resumption command control unit 133 may be operated. For example, when the command signal CMD related to the erase command and the address ADD are received, the erase command control unit 131 may transfer an erase signal and the address ADD to the operation control unit 134; when the command signal CMD related to the pause command and the address ADD are received, the pause command control unit 132 may transfer a pause signal and the address ADD to the operation control unit 134; and when the command signal CMD related to the resumption command and the address ADD are received, the resumption command control unit 133 may transfer a resumption signal and the address ADD to the operation control unit 134.

The operation control unit 134 may, according to the received address ADD and the erase signal, the pause signal, or the resumption signal, output the operating command signal OP_CMD, the row address RADD, the page control signal PBSIGNALS, and the column address CADD, and control the peripheral circuit 120 to perform the erase operation, the pause operation, or the resumption operation, respectively. For example, when the erase signal is received by the operation control unit 134, the operation control unit 134 may control the peripheral circuit 120 to perform the erase operation on a selected memory block. When the pause signal is received while the erase operation on the selected memory block is performed, the operation control unit 134 may control the peripheral circuit 120 to pause the erase operation on the selected memory block and to store a state code of the selected memory block, the state code corresponding to a paused sub-operation of the paused erase operation. After that, when the resumption signal is received by the operation control unit 134, the operation control unit 134 may determine the paused sub-operation of the paused erase operation according to the stored state code, and control the peripheral circuit 120 so that the erase operation is resumed starting from the paused sub-operation.

FIG. 5 is a flowchart for describing a process 500 of performing an operation according to an embodiment. In particular, an erase operation will be described as an illustrative embodiment, but embodiments are not limited thereto.

Referring to FIG. 5, when an erase command is received by a semiconductor device (e.g., the semiconductor device 1100 of FIG. 2) (41), a control circuit (e.g., the control circuit 130 of FIG. 2) may control a peripheral circuit (e.g., the peripheral circuit 120 of FIG. 2) to perform the erase operation of a selected memory block of a plurality of memory blocks (e.g., the memory blocks 111 of FIG. 2) (42).

Before the erase operation of the selected memory block is completed, when a pause command is received by the semiconductor device (43), the control circuit may control the peripheral circuit to pause the erase operation which is being performed (44), and to store a state code of the selected memory block in which the erase operation is paused in a storage unit (45). The storage unit may be a predetermined memory block from among the plurality of memory blocks.

After that, when a resumption command is received by the semiconductor device (46), the control circuit may control the peripheral circuit to obtain the state code by reading the storage unit, determine which sub-operation the erase operation is paused at from the state code, and resume the erase operation from the paused sub-operation (47).

The erase operation may be subdivided, and a method of storing the subdivided operations as the state codes will be described in detail below.

FIG. 6 is a diagram of various subdivided operations performed in an erase operation according to an embodiment. The erase operation may include an operation of decreasing threshold voltages of memory cells, and an operation of decreasing a width of threshold voltage distributions of the memory cells. The operation of decreasing the threshold voltages may include sub-operations related to applying an erase voltage to a selected memory block, and the operation of decreasing the width of the threshold voltage distributions of the memory cells may include sub-operations related to applying a soft program voltage to the selected memory block.

The sub-operations described above may include periods such as an erase operation start period 51, an erase voltage applying period 52, a first discharge period 53, an erase verifying period 54, a soft program setup period 55, a soft program voltage applying period 56, a second discharge period 57, a soft program verifying period 58, and an erase operation completion period 59.

In the erase operation start period 51, voltages needed for the erase operation may be set. In the erase voltage applying period 52, the erase voltage may be applied to the memory cells. In the first discharge period 53, lines to which the erase voltage is applied may be discharged. In the erase verifying period 54, an erase verifying operation may be performed to determine whether the threshold voltages of the memory cells are decreased to an erase verifying voltage.

In the soft program setup period 55, voltages needed for a soft program operation may be set. In the soft program voltage applying period 56, the soft program voltage may be applied to the memory cells. In the second discharge period 57, lines to which the soft program voltage is applied may be discharged. In the soft program verifying period 58, a soft program verifying operation may be performed to determine whether the threshold voltages of the memory cells are decreased to a soft program verifying voltage.

In the erase operation completion period 59, an operation of completing the erase operation may be performed. The periods 51 to 59 described above are only an illustrative embodiment, and may be further subdivided.

A state code of each period described above may be set as shown in the following Table 1.

TABLE 1

| Operation Period | State Code | Group |
|---|---|---|
| Erase operation start period (51) | 0000 | R1 |
| Erase voltage applying period (52) | 0001 | |
| First discharge period (53) | 0010 | R2 |
| Erase verifying period (54) | 0011 | |
| Soft program setup period (55) | 0100 | R3 |
| Soft program voltage applying period (56) | 0101 | |
| Second discharge period (57) | 0110 | R4 |
| Soft program verifying period (58) | 0111 | |
| Erase operation completion period (59) | 1000 | |

Referring to Table 1, when the erase operation of the selected memory block is paused during the erase operation start period 51, the state code of "0000" may be stored in a specified memory block. When the erase operation of the selected memory block is paused during the erase voltage applying period 52, the state code of "0001" may be stored in the specified memory block. When the erase operation of the selected memory block is paused during the first discharge period 53, the state code of "0010" may be stored in the specified memory block. When the erase operation of the selected memory block is paused during the erase verifying period 54, the state code of "0011" may be stored in the specified memory block. When the erase operation of the selected memory block is paused during the soft program setup period 55, the state code of "0100" may be stored in the specified memory block. When the erase operation of the selected memory block is paused during the soft program voltage applying period 56, the state code of "0101" may be stored in the specified memory block. When the erase operation of the selected memory block is paused during the second discharge period 57, the state code of "0110" may be stored in the specified memory block. When the erase operation of the selected memory block is paused during the soft program verifying period 58, the state code of "0111" may be stored in the specified memory block. Finally, when the erase operation of the selected memory block is paused during the erase operation completion period 59, the state code of "1000" may be stored in the specified memory block.

The periods may be grouped into groups R1 to R4 according to characteristics of each period. When a resumption command is received, it may be determined in which period the operation is paused according to the state code, and the operation may be performed again from a first period of a group corresponding to the determined period. For example, since the erase operation start period 51 and the erase voltage applying period 52 are periods before the memory cells are erased, the erase operation start period 51 and the erase voltage applying period 52 may be included in the first group R1. Since the first discharge period 53 and the erase verifying period 54 are periods in which the memory cells are erased but before the erase verifying operation is completed, the first discharge period 53 and the erase verifying period 54 may be included in the second group R2. Since the soft program setup period 55 and the soft program voltage applying period 56 are periods before the erased memory cells are soft-programmed, the soft program setup period 55 and the soft program voltage applying period 56 may be included in the third group R3. Since the second discharge period 57, the soft program verifying period 58, and the erase operation completion period 59 are periods in which the erased cells are soft-programmed but before the soft program verifying operation is completed, the second discharge period 57, the soft program verifying period 58, and the erase operation completion period 59 may be included in the fourth group R4.

In the operation 47 of FIG. 5, a control circuit (e.g., the control circuit 130 of FIG. 2) may determine which period of the operation which was being performed on the selected memory block was paused by reading memory cells of the specified memory block of the resumption operation. When the state code is "0000" or "0001", since the paused operation corresponds to the first group R1, the control circuit may control a peripheral circuit (e.g., the peripheral circuit 120 of FIG. 2) to resume the paused operation from the erase operation start period 51. When the state code is "0010" or "0011", since the paused operation corresponds to the second group R2, the control circuit may control the peripheral circuit to resume the paused operation from the first discharge period 53. When the state code is "0100" or "0101", since the paused operation corresponds to the third group R3, the control circuit may control the peripheral circuit to resume the paused operation from the soft program setup period 55. When the state code is "0110", "0111", or "1000", since the paused operation corresponds to the fourth group R4, the control circuit may control the peripheral circuit to resume the paused operation from the second discharge period 57.

As described above, the state code with respect to the period in which the operation is paused may be assigned, and a time to perform an erase operation can be reduced since the erase operation is resumed according to the state code. Further, the threshold voltage distributions of the erased memory cells can be prevented from being widened, and the stress on the semiconductor device can be prevented from being increased by preventing an over-erasure of the memory cells when the paused erase operation is subsequently completed.

Figure 7:
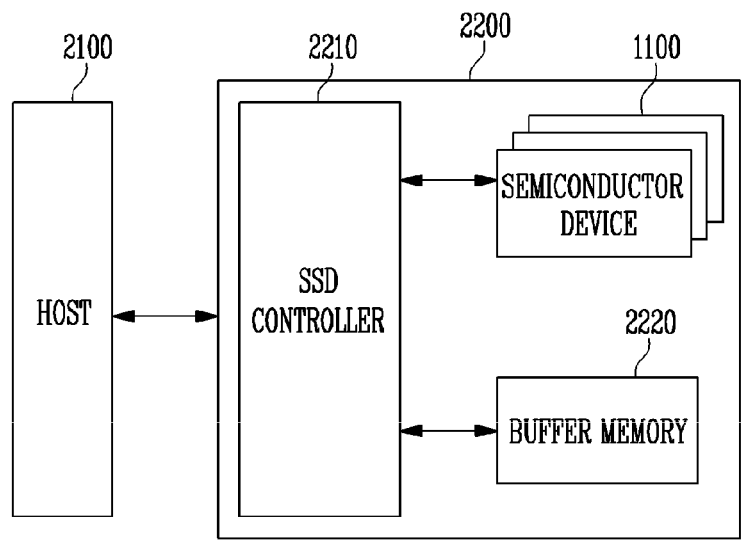
FIG. 7 is a block diagram illustrating a solid state drive including a semiconductor device according to an embodiment.

FIG. 7 is a block diagram illustrating a solid state drive including a semiconductor device according to an embodiment.

Referring to FIG. 7, a drive device 2000 may include a host 2100, and a solid state drive (SSD) 2200. The SSD 2200 may include a SSD controller 2210, a buffer memory 2220, and a semiconductor device 1100.

The SSD controller 2210 may provide a physical connection between the host 2100 and the SSD 2200. That is, the SSD controller 2210 may provide an interface with the SSD 2200 corresponding to a bus format of the host 2100. Specifically, the SSD controller 2210 may decode a command provided from the host 2100. The SSD controller 2210 may access the semiconductor device 1100 according to the decoded result. The bus format of the host 2100 may include a Universal Serial Bus (USB) protocol, a Small Computer System Interface (SCSI) protocol, a Peripheral Component Interconnect (PCI)-Express (PCI-E) protocol, an Advanced Technology Attachment (ATA) protocol, a Parallel ATA (PATA) protocol, a Serial ATA (SATA) protocol, a Serial Attached SCSI (SAS) protocol, etc.

Program data provided from the host 2100 or data read from the semiconductor device 1100 may be temporarily stored in the buffer memory 2220. When data present in the semiconductor device 1100 is cached in a read request of the host 2100, the buffer memory 2220 may support a cache function of directly providing the cached data to the host 2100. Generally, a data transmission speed by the bus format (for example, SATA or SAS) of the host 2100 may be greater than that of a memory channel of the SSD 2200. That is, when an interface speed of the host 2100 is greater than the data transmission speed of the memory channel of the SSD 2200, performance degradation generated due to a speed difference may be minimized by providing the buffer memory 2220 having a large capacity. The buffer memory 2220 may be provided as a synchronous DRAM (SDRAM) to provide a sufficient buffering in the SSD 2200 used as an auxiliary storage device having a large capacity.

The semiconductor device 1100 may be provided as a storage medium of the SSD 2200. For example, the semiconductor device 1100 may be provided as a non-volatile memory device having a large capacity described above with reference to FIG. 2, and may be provided as a NAND-type flash memory device among non-volatile memory devices.

Figure 8:
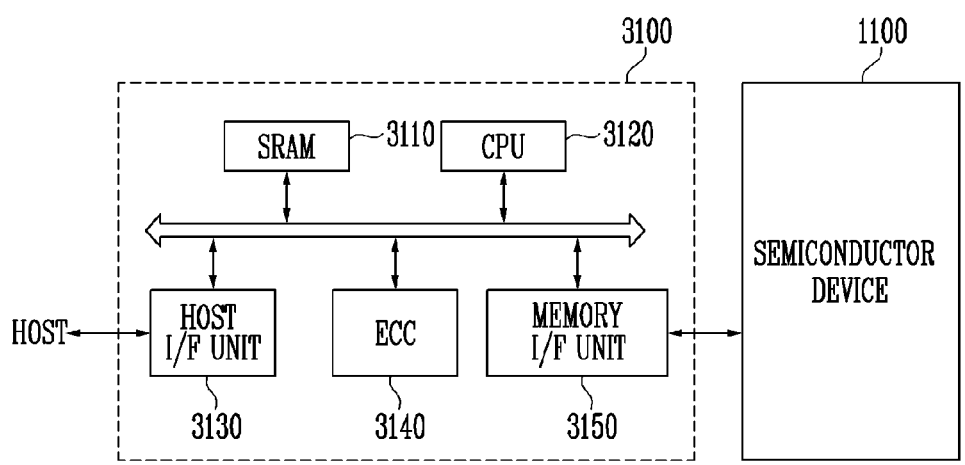
FIG. 8 is a block diagram illustrating a memory system including a semiconductor device according to an embodiment.

FIG. 8 is a block diagram illustrating a memory system including a semiconductor device according to an embodiment.

Referring to FIG. 8, a memory system 3000 according to an embodiment may include a memory controller 3100 and a semiconductor device 1100.

Since the semiconductor device 1100 may have substantially the same configuration as the semiconductor device of FIG. 2, detailed description thereof will be omitted.

The memory controller 3100 may be configured to control the semiconductor device 1100. An SRAM 3110 may be used as an operating memory of a central processing unit (CPU) 3120. A host interface (I/F) unit 3130 may have a data exchange protocol of a host HOST connected to the memory system 3000. An error correction circuit (ECC) 3140 included in the memory controller 3100 may detect and correct an error included in data read from the semiconductor device 1100. A memory interface (I/F) unit 3150 may perform an interface with the semiconductor device 1100. The CPU 3120 may perform a control operation for data exchange of the memory controller 3100. Further, although not shown in FIG. 8, the memory system 3000 may further include a read only memory (ROM) (not shown) for storing code data for an interface with the host HOST.

The memory system 3000 according to an embodiment may be applied to one among a computer, an ultra mobile personal computer (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device for wirelessly transmitting and receiving information, and various electronic devices configuring a home network.

Figure 9:
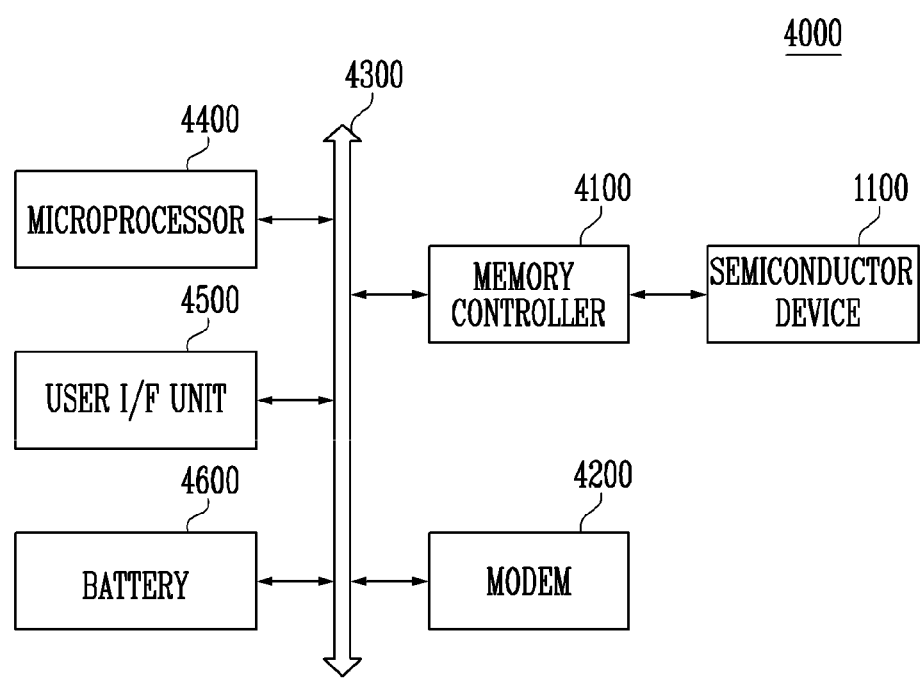
FIG. 9 is a schematic diagram illustrating a computing system including a semiconductor device according to an embodiment.

FIG. 9 is a schematic diagram illustrating a computing system including a semiconductor device according to an embodiment.

Referring to FIG. 9, a computing system 4000 according to an embodiment may include a semiconductor device 1100, a memory controller 4100, a modem 4200, a microprocessor 4400, and a user interface (I/F) unit 4500, which are electrically connected to a bus 4300. When the computing system 4000 is a mobile device, a battery 4600 for supplying an operating voltage of the computing system 4000 may be further included. Although not shown, the computing system 4000 according to an embodiment may further include an application chipset, a camera image processor (CIS), a mobile DRAM, etc.

Since the semiconductor device 1100 may have substantially the same configuration as the semiconductor device of FIG. 2, detailed description thereof will be omitted.

The memory controller 4100 and the semiconductor device 1100 may be components of an SSD.

The semiconductor device 1100 and the memory controller 4100 may be mounted using various types of packages.

For example, the semiconductor device 1100 and the memory controller 4100 may be packaged and mounted in a manner such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi-chip package (MCP), a wafer-level fabricated package (WFP), a wafer-level processed stack package (WSP), or the like.

Embodiments of the present disclosure can reduce an operating time required when an operation paused by a pause command during an operation of a semiconductor device is resumed by a resumption command, and can reduce the stress of the semiconductor device by avoiding a repetitive operation.

The technical spirit described above has been described in detail with reference to illustrative embodiments, but it should be noted that the embodiments are provided for description and not for purposes of limitation. Therefore, it will be understood by those of ordinary skill in the art that various changes in form and details may be made therein without departing from the spirit and scope of the present disclosure as defined by the following claims.

What is claimed is:

1. A method of operating a semiconductor device including a plurality of memory blocks, the method comprising:
    dividing an operation of the semiconductor device into a plurality of periods, and determining a plurality of state codes respectively indicating the periods;
    performing the operation according to a received command;
    when a pause command is received, pausing the operation and storing a state code of the plurality of state codes indicating a paused period in which the operation is paused among the plurality of periods, the state code being stored in a first memory block among the plurality of memory blocks;
    retrieving the stored state code from the first memory block in response to a resumption command being received; and
    resuming the operation starting from the paused period indicated by the retrieved state code.

2. The method of claim 1, wherein the operation is a program operation, a read operation, or an erase operation.

3. The method of claim 1, wherein the operation is an erase operation and wherein the received command is an erase command, the method further comprising:
    performing the erase operation when the erase command is received.

4. The method of claim 3, wherein the plurality of periods includes an erase operation start period, an erase voltage applying period, a first discharge period, an erase verifying period, a soft program setup period, a soft program voltage applying period, a second discharge period, a soft program verifying period, and an erase operation completion period.

5. The method of claim 4,
    wherein in the erase operation start period, voltages needed for the erase operation are set,
    wherein in the erase voltage applying period, an erase voltage is applied to memory cells of the semiconductor device,
    wherein in the first discharge period, lines to which the erase voltage is applied are discharged, wherein in the erase verifying period, an erase verifying operation for determining whether threshold voltages of the memory cells are decreased to an erase verifying voltage is performed, wherein in the soft program setup period, voltages needed for a soft program operation are set, wherein in the soft program voltage applying period, a soft program voltage is applied to the memory cells, wherein in the second discharge period, lines to which the soft program voltage is applied are discharged, wherein in the soft program verifying period, a soft program verifying operation for determining whether the threshold voltages of the memory cells are decreased to a soft program verifying voltage is performed, and wherein in the erase operation completion period, an operation of completing the erase operation is performed.

6. The method of claim 4, wherein the state codes respectively corresponding to the periods are different from each other.

7. The method of claim 6, wherein each of the state codes includes a plurality of bits.

8. The method of claim 7, wherein the state code corresponding to the erase operation start period is 0000, wherein the state code corresponding to the erase voltage applying period is 0001, wherein the state code corresponding to the first discharge period is 0010, wherein the state code corresponding to the erase verifying period is 0011, wherein the state code corresponding to the soft program setup period is 0100, wherein the state code corresponding to the soft program voltage applying period is 0101, wherein the state code corresponding to the second discharge period is 0110, wherein the state code corresponding to the soft program verifying period is 0111, and wherein the state code corresponding to the erase operation completion period is 1000.

9. The method of claim 6, wherein the state codes corresponding to the erase operation start period and the erase voltage applying period are included in a first group, wherein the state codes corresponding to the first discharge period and the erase verifying period are included in a second group, wherein the state codes corresponding to the soft program setup period and the soft program voltage applying period are included in a third group, and wherein the state codes corresponding to the second discharge period, the soft program verifying period, and the erase operation completion period are included in a fourth group.

10. The method of claim 9, wherein, when the resumption command is received, the operation is performed from the erase operation start period when the read state code is included in the first group, the operation is performed from the first discharge period when the read state code is included in the second group, the operation is performed from the soft program setup period when the read state code is included in the third group, and the operation is performed from the second discharge period when the read state code is included in the fourth group.

11. A semiconductor device, comprising:
a plurality of memory blocks;
a peripheral circuit configured to perform a program operation, a read operation, or an erase operation of a selected memory block among the plurality of memory blocks; and
a control circuit configured to control the peripheral circuit to pause an operation performed on the selected memory block, store a state code indicating a paused period in which the operation is paused when a pause command is received, the state code being stored in a first memory block among the plurality of memory blocks, retrieve the stored state code from the first memory block in response to a resumption command being received, and resume the paused operation of the selected memory block starting from the paused period indicated by the retrieved state code.

12. The semiconductor device of claim 11, wherein the state code is set according to subdivided periods of the program operation, the read operation, or the erase operation.

13. The semiconductor device of claim 11, wherein the control circuit comprises:
an erase command control unit configured to output an erase signal in response to a command signal related to the erase operation and an address;
a pause command control unit configured to output a pause signal in response to a command signal related to a pause operation and the address;
a resumption command control unit configured to output a resumption signal in response to a command signal related to a resumption operation and the address; and
an operation control unit configured to control the peripheral circuit to perform the operation of the selected memory block in response to the erase signal, the pause signal, or the resumption signal and the address.

14. The semiconductor device of claim 13, wherein the operation control unit controls the peripheral circuit to perform the erase operation of the selected memory block in response to the erase signal and the address.

15. The semiconductor device of claim 13, wherein the operation control unit controls the peripheral circuit to store the state code in the specified memory block after pausing the operation performed on the selected memory block in response to the pause signal and the address.

16. The semiconductor device of claim 13, wherein the operation control unit determines a paused period in which the erase operation is paused from the state code stored in the specified memory block in response to the resumption signal and the address, and controls the peripheral circuit to perform the operation according to the paused period.

17. A semiconductor device, comprising:
a first memory block in which normal data is stored;
a second memory block in which a state code indicating a paused period of an operation which is performed in the first memory block is stored, the operation including a plurality of periods;
a peripheral circuit configured to perform a program, read, or erase operation of the first memory block, store the state code in the second memory block, and read the state code from the second memory block; and
a control circuit configured to control the peripheral circuit to store the state code in the second memory block when the operation is temporarily paused in response to a pause command, retrieve the stored state code in response to a resumption command being received, and resume the operation staring from the paused period indicated by the retrieved state code.

18. The semiconductor device of claim 17, wherein the state code includes a plurality of bits, and wherein values of the state code respectively corresponding to different paused operations are different from each other.

19. The semiconductor device of claim 17, wherein the control circuit determines a state of the paused operation according to the state code, and controls the peripheral circuit to perform the operation from the paused period.

\* \* \* \* \*